| (12) | United States Patent | (10) Patent No.: | US 9,198,330 B2 |
|---|---|---|---|
| | Wei et al. | (45) Date of Patent: | Nov. 24, 2015 |

(54) SERVER

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Chao-Ke Wei, New Taipei (TW); Li-Fang Fan, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 141 days.

(21) Appl. No.: 14/140,574

(22) Filed: Dec. 26, 2013

(65) Prior Publication Data

US 2015/0146363 A1 May 28, 2015

(30) Foreign Application Priority Data

Nov. 26, 2013 (CN) .......................... 2013 1 06044634

(51) Int. Cl.
    *H05K 7/20* (2006.01)
(52) U.S. Cl.
    CPC .................................. *H05K 7/20727* (2013.01)
(58) Field of Classification Search
    CPC .......... H05K 7/20727; H05K 7/20736; H05K 7/20145; G02F 2201/36
    USPC ....................................................... 361/679.33
    See application file for complete search history.

(56) References Cited

U.S. PATENT DOCUMENTS

| 5,440,450 | A  | * | 8/1995  | Lau et al. ....................... 361/695 |
| 6,445,586 | B1 | * | 9/2002  | Chou ............................. 361/725 |
| 2003/0133266 | A1 | * | 7/2003  | Behl et al. ..................... 361/695 |
| 2011/0134594 | A1 | * | 6/2011  | Cheng et al. ................. 361/679.5 |
| 2011/0266229 | A1 | * | 11/2011 | Elwany ............................ 211/26 |
| 2012/0128507 | A1 | * | 5/2012  | Scheidler ........................ 417/32 |
| 2014/0063726 | A1 | * | 3/2014  | Liu ........................... 361/679.33 |

* cited by examiner

*Primary Examiner* — Jinhee Lee
*Assistant Examiner* — Keith Depew
(74) *Attorney, Agent, or Firm* — Novak Druce Connolly Bove + Quigg LLP

(57) ABSTRACT

A server includes a chassis including a first sidewall, a second sidewall, a rear wall, a front wall, and a partition wall. A receiving space to receive a power module is bound by the front wall, the partition wall, and front portions of the first and second sidewalls. A number of through holes is defined in each of the rear wall, the front wall, and the front portions of the first and second sidewalls. An outlet and an inlet of the power module face the first sidewall and the second sidewall, respectively. A part of the partition wall between the inlet and the first sidewall does not define through holes. Another part of the partition wall defines a number of through holes. A number of data storage devices is located between the partition wall and the rear wall. A number of fans is located outside the rear wall.

2 Claims, 1 Drawing Sheet

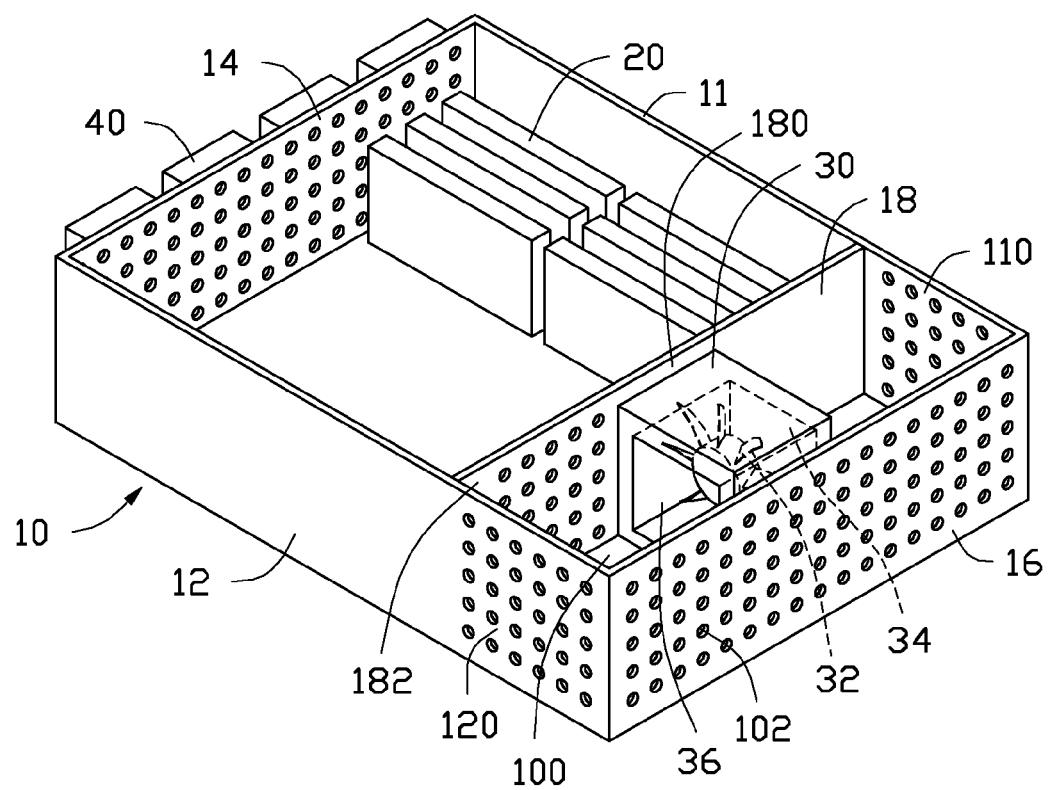

SERVER

BACKGROUND

1. Technical Field

The present disclosure relates to a server.

2. Description of Related Art

Power modules are often mounted at sides of storage devices, thus, hot air of the power modules is easily blown toward the storage devices, and meanwhile, hot air of the storage devices is easily blown toward the power modules. As a result, the power modules may be heated up by the hot air of the storage devices, and the storage devices may be heated up by the hot air of the power modules.

BRIEF DESCRIPTION OF THE DRAWING

Many aspects of the present embodiments can be better understood with reference to the following drawing. The components in the drawing are not necessarily drawn to scale, the emphasis instead being placed upon clearly illustrating the principles of the present embodiments. Moreover, in the drawing, the view is schematic, and like reference numerals designate corresponding parts throughout the several views.

The FIGURE is an assembled, isometric view of an embodiment of a server.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

The FIGURE shows an illustrated embodiment of a server. The server includes a chassis 10, a plurality of data storage devices 20, a power module 30, and a plurality of first fans 40.

The chassis 10 includes a first sidewall 11, a second sidewall 12 parallel to the first sidewall 11, a rear wall 14 perpendicularly connected between rear ends of the first sidewall 11 and second sidewall 12. In addition, a front wall 16 perpendicularly connected between front ends of the first sidewall 11 and second sidewall 12, and a partition wall 18 perpendicularly connected between the first sidewall 11 and second sidewall 12 and adjacent to the front wall 16. The front wall 16, the partition wall 18, a front portion 110 of the first sidewall 11 between the partition wall 18 and the front wall 16, and a front portion 120 of the second sidewall 12 between the partition wall 18 and the front wall 16, bound a receiving space 100. The rear wall 14, the front wall 16, and the front portions 110 and 120 of the first and second sidewalls 11 and 12 each define a plurality of through holes 102.

The power module 30 is received in the receiving space 100. A second fan 32 is mounted in the power module 30. The power module 30 defines an outlet 34 facing the front portion 110, and an inlet 36 facing the front portion 120. A first part 180 of the partition wall 18 between the inlet 36 and the first sidewall 11 does not define through holes. A second part 182 of the partition wall 18 between the inlet 36 and the second sidewall 12 defines a plurality of through holes 102.

The data storage devices 20 are located between the partition wall 18 and the rear wall 14.

The first fans 40 are located outside the rear wall 14.

In use, some of cool air outside the chassis 10 is guided into the inlet 36 through the through holes 102 of the front portions 120 and the front wall 16 by the second fan 32, and some more of cool air is blown toward the storage devices 20 through the through holes 102 of the front portions 120, the front wall 16, and the partition wall 18, by the first fans 40. Hot air of the power module 30 blows out of the chassis 10 through the outlet 34 and the through holes 102 of the front portion 110. Hot air of the storage devices 20 blows out of the chassis 10 through the through holes 102 of the rear wall 14. Therefore, the partition wall 18 can avoid the hot air of the data storage devices 20 blowing toward the power module 30.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A server, comprising:
a chassis comprising a first sidewall, a second sidewall, a rear wall connected between rear ends of the first sidewall and the second sidewall, a front wall connected between front ends of the first sidewall and the second sidewall, and a partition wall connected between the first sidewall and the second sidewall and adjacent to the front wall; wherein a receiving space is bounded by the front wall, the partition wall, and front portions of the first and second sidewalls between the front wall and the partition wall, each of the rear wall, the front wall, and the front portions of the first and second sidewalls defines a plurality of through holes;
a plurality of data storage devices located between the partition wall and the rear wall;
a power module received in the receiving space and comprising a second fan; wherein an outlet of the power module faces the front portion of the first sidewall, an inlet of the power module faces the front portion of the second sidewall; and
a plurality of first fans located outside the rear wall;
wherein a first part of the partition wall between the inlet of the power module and the first sidewall does not define through holes, a second part of the partition wall between the inlet of the power module and the second sidewall defines a plurality of through holes.

2. The server of claim 1, wherein cool air outside the chassis is guided into the inlet through the through holes of the front wall by the second fan, and blows toward the storage devices through the through holes of the partition wall by the first fans.

* * * * *